United States Patent
Kim et al.

(10) Patent No.: US 10,935,597 B2
(45) Date of Patent: Mar. 2, 2021

(54) SEMICONDUCTOR DEVICE INCLUDING TEST CIRCUIT

(71) Applicant: SK hynix Inc., Gyeonggi-do (KR)

(72) Inventors: Seong Jin Kim, Gyeonggi-do (KR); Dae Ho Yun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/879,498

(22) Filed: Jan. 25, 2018

(65) Prior Publication Data

US 2018/0372795 A1 Dec. 27, 2018

(30) Foreign Application Priority Data

Jun. 21, 2017 (KR) .......... 10-2017-0078731

(51) Int. Cl.
*G01R 31/28* (2006.01)
*G01R 31/3185* (2006.01)
*H01L 21/66* (2006.01)

(52) U.S. Cl.
CPC ..... *G01R 31/2879* (2013.01); *G01R 31/2831* (2013.01); *G01R 31/2856* (2013.01); *G01R 31/318511* (2013.01); *H01L 22/34* (2013.01); *H01L 22/32* (2013.01)

(58) Field of Classification Search
CPC . G01R 31/2879; G01R 31/2831; H01L 22/34; H01L 22/32
USPC .......................................................... 257/48
See application file for complete search history.

(56) References Cited

U.S. PATENT DOCUMENTS

| 5,434,513 A * | 7/1995 | Fujii .................. G01R 1/07378 |
| | | 324/754.07 |
| 2005/0026315 A1* | 2/2005 | Cowles ............. G01R 31/2884 |
| | | 438/18 |
| 2008/0175080 A1* | 7/2008 | Kim ............... G01R 31/318511 |
| | | 365/201 |
| 2011/0115519 A1* | 5/2011 | Tokunaga .......... G01R 31/2889 |
| | | 324/762.05 |
| 2011/0254000 A1* | 10/2011 | Han ....................... H01L 22/32 |
| | | 257/48 |
| 2015/0116338 A1 | 4/2015 | Cho et al. |
| 2016/0196857 A1* | 7/2016 | Lee .......................... G11C 5/02 |
| | | 365/189.02 |
| 2018/0233212 A1* | 8/2018 | Park ..................... G11C 29/006 |

FOREIGN PATENT DOCUMENTS

| KR | 1020060066500 | 6/2006 |
| KR | 1020150136874 | 12/2015 |

OTHER PUBLICATIONS

Office Action issued by Chinese Patent Office dated Apr. 10, 2020.

* cited by examiner

*Primary Examiner* — Tong-Ho Kim
(74) *Attorney, Agent, or Firm* — IP & T Group LLP

(57) ABSTRACT

A semiconductor device including a test circuit is disclosed. The semiconductor device includes a test pad coupled to a probe of a test device during a wafer test; a normal pad configured to receive a power or a signal during a normal mode; and a test circuit configured to perform a predetermined test operation based on a test signal received through the test pad. The test circuit is disposed below the normal pad.

7 Claims, 3 Drawing Sheets

SEMICONDUCTOR DEVICE INCLUDING TEST CIRCUIT

CROSS-REFERENCE TO RELATED APPLICATION

The present application claims priority under 35 U.S.C. § 119(a) to Korean patent application No. 10-2017-0078731, filed on Jun. 21, 2017, the disclosure of which is herein incorporated by reference in its entirety.

BACKGROUND OF THE INVENTION

Embodiments of the present disclosure relate to a semiconductor device, and more particularly to a semiconductor device for improving a layout structure of a test circuit used in wafer testing.

Generally, integrated circuits (ICs) of semiconductor devices are manufactured as dies on a wafer, and are isolated from one another and then packaged.

To prevent unnecessary costs associated with packaging defective integrated circuits (ICs) from among all integrated circuits (ICs), it is preferable that all integrated circuits (ICs) undergo testing in a wafer state.

Such wafer testing may include a series of steps. In more detail, when a test mode is entered in response to a test mode signal at a high level, the wafer testing may include transmitting a test signal to a test circuit through a test pad by allowing a probe to contact the test pad which is isolated from a normal pad, and monitoring signals generated from the test circuit based on the test signal.

In accordance with the related art, after a test circuit used in wafer testing has been formed in a main circuit region of a semiconductor device, Electric Parameter Monitor (EPM) measurement of the test circuit is performed using pads or input/output (I/O) pins during a test mode of the semiconductor device.

However, guaranteeing a net die of semiconductor devices and guaranteeing Power Distribution Network (PDN) characteristics are becoming increasingly important. Additionally, the region occupied by a test circuit formed in each semiconductor device is gradually increasing in size.

In the case of using a pad configured to interconnect the inside and outside of each semiconductor device, the region occupied by the pad is large in size compared to a total region of the semiconductor device. However, since impact caused by physical contact of the probe occurs in wafer testing, no circuit is formed below the pad.

BRIEF SUMMARY OF THE INVENTION

Various embodiments of the present disclosure are directed to providing a semiconductor device including a test circuit that substantially obviates one or more problems due to limitations and disadvantages of the related art.

An embodiment of the present disclosure relates to a semiconductor device for guaranteeing a maximum number of net dies and power distribution network (PDN) characteristics by improving a layout structure of a test circuit used in wafer testing.

In accordance with an aspect of the present disclosure, a semiconductor device includes: a test pad configured to be coupled to a probe of a test device during a wafer test; a normal pad configured to receive power or a signal during a normal mode; and a test circuit configured to perform a predetermined test operation based on a test signal received through the test pad, wherein the test circuit is disposed below the normal pad.

In accordance with another aspect of the present disclosure, a semiconductor device includes: a first pad; a second pad; and a switching element electrically coupled to the first pad, and disposed below the second pad.

It is to be understood that both the foregoing general description and the following detailed description of embodiments are exemplary and explanatory.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Figure 1:
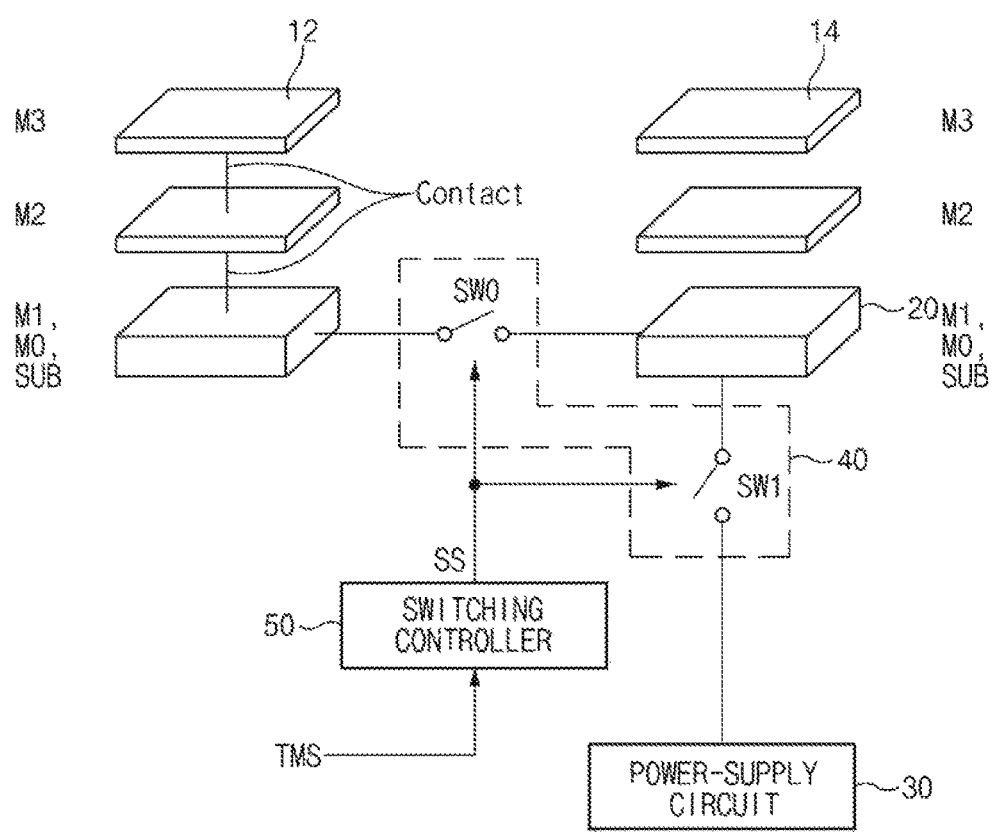
FIG. 1 is a structural diagram illustrating a semiconductor device according to an embodiment of the present disclosure.

Reference will now be made in detail to certain embodiments, examples of which are illustrated in the accompanying drawings. Prior to description, the terms or words used in the disclosure and the claims are not interpreted as having general meanings or dictionary meanings, but should be interpreted as having meanings and concepts coinciding with the technical scope and sprit of the present disclosure based on the principle in that an inventor may properly define the concept of terms to describe the present disclosure in the best mode. Therefore, the embodiments described in the specification and shown in the drawings are purely illustrative and are not intended to represent all aspects of the invention, such that various equivalents and modifications may be made without departing from the spirit of the invention.

FIG. 1 is a structural diagram illustrating a semiconductor device according to an embodiment of the present disclosure.

Referring to FIG. 1, a semiconductor device or a semiconductor chip according to one embodiment of the present disclosure may include a test pad 12, a normal pad 14, a test circuit 20, a power-supply circuit 30, a switching circuit 40, and a switching controller 50.

The test pad 12 may be a pad electrically coupled to a test-purposed probe card pin needed for a test device during wafer testing. That is, the test pad 12 may be used only to test the semiconductor device in a wafer state. In a package state after completion of the wafer testing, the test pad 12 is not in use. The test pad 12 may be formed in a metal-3 (M3) layer. The test pad 12 may be coupled to metal lines formed in lower metal layers M2, M1, and M0 and circuits formed on the substrate SUB through contacts. The metal layers M0-M3 are layers in which metal layers for transmitting a signal or power in a semiconductor device are formed. The metal layer M0 is the lowest metal layer, and metal layers M1, M2, and M3 are formed over the metal layer M0, consecutively. Although FIG. 1 has exemplarily disclosed only one test pad 12 for convenience of description and better understanding of the present disclosure, a plurality of test pads may be present.

During a normal mode in which the semiconductor device performs a normal operation except for a test operation, the normal pad 14 may receive external power, or may transmit one or more signals that is, data. The normal pad 14 may be a pad that is not used during the wafer testing, and may be a pad that is wire-bonded or bumped during packaging. The normal pad 14 may also be formed in the metal-3 (M3) layer. At least one metal line M2, M1, and M0 may be formed between the normal pad 14 and the test circuit 20.

The test circuit 20 may be electrically coupled to the test pad 12 through a first switch SW0 of the switching circuit 40. If the test circuit 20 receives a test signal applied to the test pad 12 through the switching circuit 40, the test circuit 20 may perform predetermined test operations, and may output the results of the test operations, during the wafer testing. The test circuit 20 may be used only for the wafer testing in which the test pad 12 is used, and may not affect normal operations in which the normal pad 14 is used. Specifically, the test circuit 20 according to this embodiment may be formed below the normal pad 14. That is, the test circuit 20 may be formed using a substrate SUB including an active region and isolation region, and metal lines M0 and M1 disposed below the normal pad 14. In this case, the test circuit 20 may be disposed below the normal pad 14 such that all or some of the test circuit 20 may overlap with the normal pad 14 in a vertical direction perpendicular to a bottom surface of the normal pad 14.

The power-supply circuit 30 may provide the test circuit 20 with an operation power-supply voltage. The power-supply circuit 30 may be selectively coupled to the test circuit 20 through a second switch SW1 of the switching circuit 40, thereby providing the operation power-supply voltage during the wafer testing.

The switching circuit 40 may be switched on or off based on a switching signal SS generated from the switching controller 50, such that the test circuit 20 can be electrically coupled to the test pad 12 and the power-supply circuit 30, or electrically separated from the test pad 12 and the power-supply circuit 30. For example, the first and second switches SW0 and SW1 of the switching circuit 40 may be switched on when the switching signal SS is activated. In this case, the test circuit 20 may be electrically coupled to the test pad 12 and the power-supply circuit 30. In contrast, when the switching signal SS is deactivated, the switching circuit 40 may be switched off. In this case, the test circuit 20 may be electrically isolated from the test pad 12 and the power-supply circuit 30. The switching circuit 40 may include the first switch SW0 and the second switch SW1. The first switch SW0 may selectively interconnect the test pad 12 and the test circuit 20 based on the switching signal SS. The second switch SW1 may selectively interconnect the test pad 12 and the power-supply circuit 30 based on the switching signal SS.

The switching controller 50 may activate the switching signal SS during the wafer testing, such that the first and second switches SW0 and SW1 of the switching circuit 40 are switched on. During a normal mode after completion of the wafer testing, the switching controller 50 deactivates the switching signal SS, such that the first and second switches SW0 and SW1 of the switching circuit 40 are switched off. For example, the switching controller 50 may output the switching signal SS based on a test mode signal TMS generated during the wafer testing.

Figure 2:
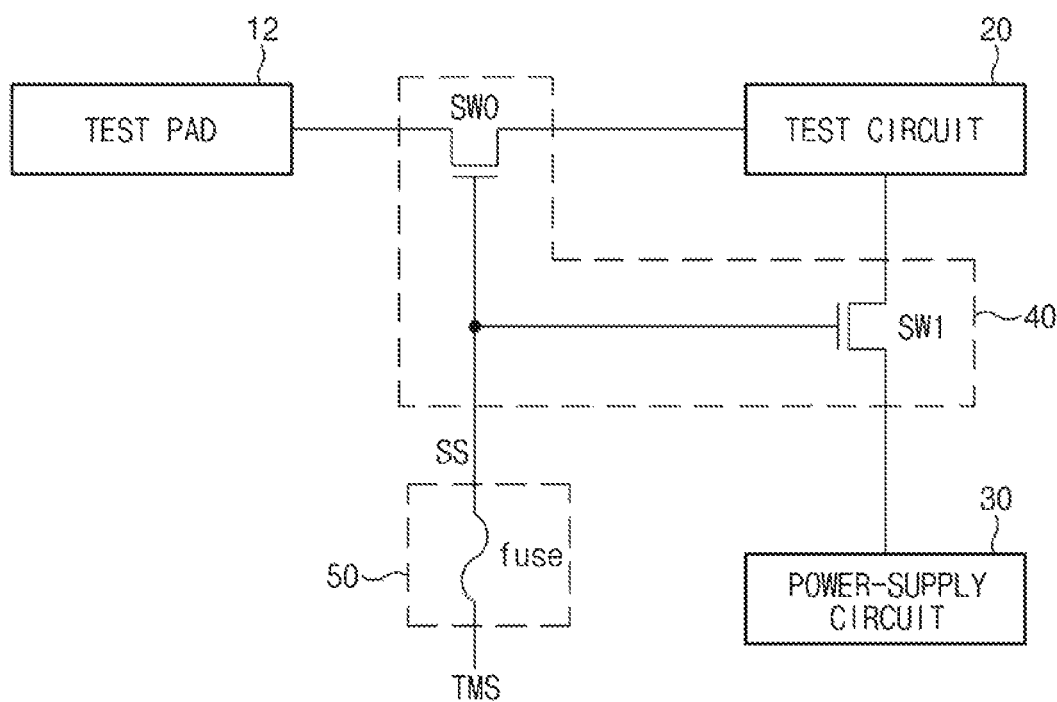
FIG. 2 is a structural diagram illustrating a switching circuit and a switching controller shown in FIG. 1.

FIG. 2 is a structural diagram illustrating the switching circuit 40 and the switching controller 50 shown in FIG. 1.

Referring to FIG. 2, each of the first and second switches SW0 and SW1 of the switching circuit 40 may include a metal oxide semiconductor (MOS) transistor for example, an NMOS transistor, selectively switched on or off based on the switching signal SS.

The switching controller 50 may include a fuse coupled between an input terminal of the test mode signal TMS and the first and second switches SW0 and SW1 of the switching circuit 40. For example, the fuse may be coupled between the terminal receiving the test mode signal TMS and a common gate node of the MOS transistors corresponding to the first and second switches SW0 and SW1. The fuse may remain uncut during the wafer testing, and may be cut or severed after completion of the wafer testing.

Therefore, during the wafer testing, the switching controller 50 may transmit the test mode signal TMS, such that the test mode signal TMS may be output as the switching signal SS. Therefore, since the first and second switches SW0 and SW1 are switched on, the test circuit 20 may receive the operation power-supply voltage from the power-supply circuit 30, and may perform the test operation based on the test signal received through the test pad 12.

Furthermore, since the test circuit 30 is no longer required after completion of the wafer testing, the fuse is cut or blown to cut off a transmission path of the test mode signal TMS such that the switching signal SS is deactivated and the first and second switches SW0 and SW1 are switched off. As a result, the test circuit 20 may be electrically isolated from the test pad 12 and the power-supply circuit 30.

Figure 3:
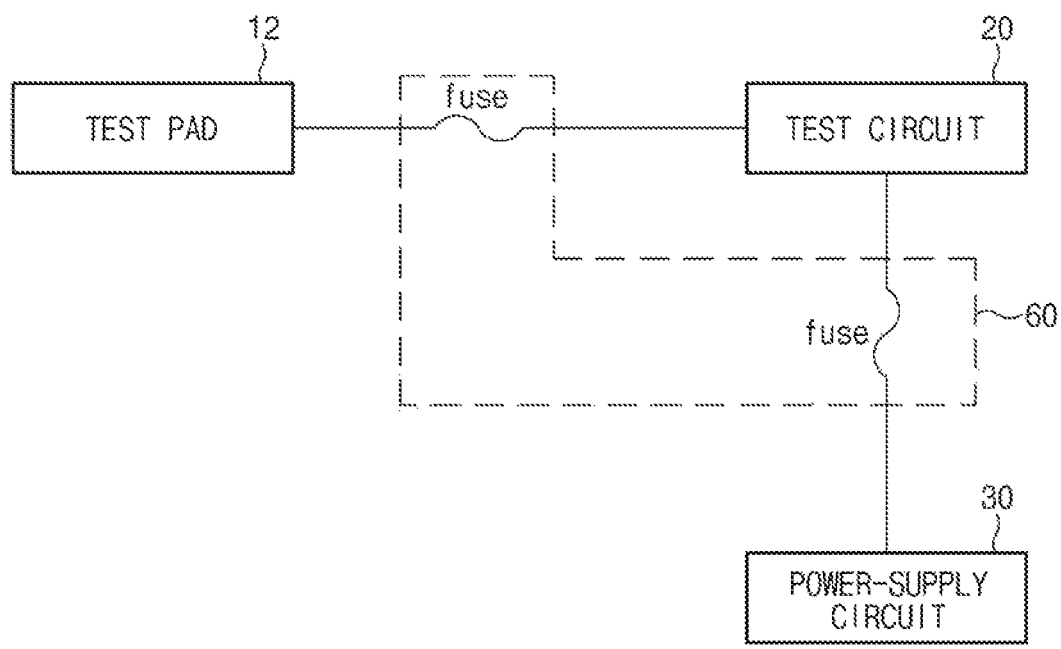
FIG. 3 is a structural diagram illustrating a switching circuit according to another embodiment of the present disclosure.

FIG. 3 is a structural diagram illustrating a switching circuit according to another embodiment of the present disclosure.

Although the above-mentioned embodiment has disclosed that the switching circuit 40 of FIGS. 1 and 2 is formed of a switching element for example, a MOS transistor, which is selectively switched on or off based on the switching signal SS for convenience of description, it should be noted that a switching circuit 60 illustrated in FIG. 3 can also be formed with a fuse without departing from the scope or spirit of the present disclosure.

The switching circuit 60 for use in the present disclosure may electrically couple the test circuit 20 to the test pad 12 and the power-supply circuit 30, during wafer testing. Upon completion of the wafer testing, the switching circuit 60 may electrically detach and isolate the test circuit 20 from the test pad 12 and the power-supply circuit 30.

Therefore, as can be seen from this embodiment, if the switching circuit 60 is formed with the fuse, the fuse of the switching circuit 60 is blown or cut in a wafer state after completion of the wafer testing such that original purposes can be achieved.

In this case, the switching controller 50 may not be formed.

As described above, the test circuit 20 used only in the wafer testing is distinguished from other circuit structures, and is then disposed below the normal pad 14 not used in the wafer testing.

As a result, physical stress applied to the test pad 12 which physically contacts a probe during the wafer testing to the test circuit 20 can be minimized.

Whereas the related art does not include a circuit in a region disposed below the normal pad 14, the present disclosure includes the test circuit 10, which is temporarily used only in the wafer testing, in a region that is, a pad region, disposed below the normal pad 14. Accordingly, the size of a region needed to construct circuits within the semiconductor device can be reduced by the size of the test circuit 10, and thus the size of a necessary region can be minimized and a maximum number of net dies can be guaranteed. In addition, after completion of the wafer testing, the test circuit 10 is electrically isolated, resulting in acquisition of PDN characteristics.

Although the test circuit 20 is formed below the normal pad 14, the test circuit 20 is needed only for the wafer testing and is not necessary for other purposes, and is electrically isolated from other circuit structures after completion of the wafer testing. As a result, although stress or impact is applied to the normal pad 14 due to wire bonding or the like during a packaging process, the operation of the semiconductor device is not affected.

As is apparent from the above description, the embodiments of the present disclosure can guarantee a maximum number of net dies and power distribution network (PDN) characteristics by improving a layout structure of a test circuit used in wafer testing of the semiconductor device.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The above embodiments are not limited by the type of deposition, etching polishing, and patterning steps described herein. Nor is the embodiment limited to any specific type of semiconductor device. For example, the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a test pad configured to be coupled to a probe of a test device during a wafer test;
   a normal pad configured to receive power or a signal during a normal mode; and
   a test circuit configured to perform a predetermined test operation based on a test signal received through the test pad,
   wherein all or some of the test circuit is arranged to overlap with the normal pad in a direction perpendicular to a bottom surface of the normal pad, and
   wherein the test circuit is not coupled to the normal pad during the wafer test.

2. The semiconductor device according to claim 1, further comprising:
   a first switch configured to selectively and electrically couple the test pad to the test circuit based on a switching signal; and
   a switching controller configured to output the switching signal based on a control signal that is activated during the wafer test.

3. The semiconductor device according to claim 2, wherein:
   the switching controller activates the switching signal by transmitting the control signal as the switching signal during the wafer test; and
   the switching controller deactivates the switching signal by preventing transmission of the control signal during the normal mode.

4. The semiconductor device according to claim 3, wherein the switching controller includes:
   a fuse coupled between an input terminal of the control signal and the first switch.

5. The semiconductor device according to claim 2, further comprising:
   a power-supply circuit configured to provide the test circuit with an operation power-supply voltage; and
   a second switch configured to selectively and electrically couple the power-supply circuit to the test circuit based on the switching signal.

6. The semiconductor device according to claim 1, further comprising:
   metal lines disposed between the normal pad and the test circuit.

7. The semiconductor device according to claim 1, further comprising:
   a fuse configured to electrically couple the test pad to the test circuit during the wafer test.

* * * * *